(12) United States Patent
Morshed

(10) Patent No.: US 10,182,499 B2
(45) Date of Patent: Jan. 15, 2019

(54) MULTILAYER ADDITIVE PRINTED CIRCUIT

(71) Applicant: The University of Memphis Research Foundation, Memphis, TN (US)

(72) Inventor: Bashir I. Morshed, Germantown, TN (US)

(73) Assignee: The University of Memphis Research Foundation, Memphis, TN (US)

( * ) Notice: Subject to any disclaimer, the term of this patent is extended or adjusted under 35 U.S.C. 154(b) by 0 days.

(21) Appl. No.: 15/346,847

(22) Filed: Nov. 9, 2016

(65) Prior Publication Data
US 2017/0135215 A1 May 11, 2017

Related U.S. Application Data

(60) Provisional application No. 62/252,706, filed on Nov. 9, 2015.

(51) Int. Cl.
*H05K 1/18* (2006.01)
*H05K 1/11* (2006.01)
(Continued)

(52) U.S. Cl.
CPC ............ *H05K 1/181* (2013.01); *H05K 1/028* (2013.01); *H05K 1/0353* (2013.01); *H05K 1/097* (2013.01); *H05K 1/113* (2013.01); *H05K 3/125* (2013.01); *H05K 3/303* (2013.01); *H05K 3/4007* (2013.01); *H05K 3/4053* (2013.01); *H05K 3/4069* (2013.01); *H05K 3/4664* (2013.01); *H05K 2201/1003* (2013.01);
(Continued)

(58) Field of Classification Search
CPC ...... H05K 1/181; H05K 1/028; H05K 1/0353; H05K 1/097; H05K 1/113; H05K 3/125; H05K 3/303; H05K 3/4007; H05K 3/4053; H05K 3/4069; H05K 3/4664
USPC ........................................................ 361/749
See application file for complete search history.

(56) References Cited

U.S. PATENT DOCUMENTS

| 5,148,355 A | * | 9/1992 | Lowe | ........................ | H05K 1/16 |
| | | | | | 174/68.1 |
| 2006/0072944 A1 | * | 4/2006 | Sharma | ................... | H04L 45/00 |
| | | | | | 399/308 |

(Continued)

*Primary Examiner* — Timothy Thompson
*Assistant Examiner* — Charles Pizzuto
(74) *Attorney, Agent, or Firm* — Mintz Levin Cohn Ferris Glovsky and Popeo, P.C.; Peter F. Corless

(57) ABSTRACT

A multilayer printed circuit as well as printed passive and active electronic components using additive printing technology is provided. The fabrication process includes a substrate and a first conductive layer that is printed with conductive ink on the substrate. An insulation layer that has uniform thickness is printed on the first conductive layer and the substrate, less via cavities, test point cavities, and a surface mount component contact point and mounting cavities. The insulation layer is replaceable with resistive layer or semi-conductive layer to fabricate electronic components. The vias are printed with conductive ink inside of the via cavities. Additionally, a second conductive layer is printed on the vias and over the insulation layer. The insulation, resistive, or semi-conducting layer, the vias, and the conductive layers are repeatedly printed in sequence to thus form the multilayer printed circuit.

17 Claims, 15 Drawing Sheets

(51) Int. Cl.
    *H05K 3/40*     (2006.01)
    *H05K 3/46*     (2006.01)
    *H05K 1/03*     (2006.01)
    *H05K 3/12*     (2006.01)
    *H05K 1/09*     (2006.01)
    *H05K 1/02*     (2006.01)
    *H05K 3/30*     (2006.01)

(52) U.S. Cl.
    CPC .............. *H05K 2201/10015* (2013.01); *H05K 2201/10022* (2013.01); *H05K 2201/10106* (2013.01); *H05K 2201/10143* (2013.01); *H05K 2201/10151* (2013.01); *H05K 2201/10166* (2013.01); *H05K 2201/10174* (2013.01)

(56) References Cited

U.S. PATENT DOCUMENTS

| | | | |
|---|---|---|---|
| 2007/0111380 A1* | 5/2007 | Cho ........................ | H05K 1/162 438/106 |
| 2009/0145652 A1* | 6/2009 | En ........................ | C23C 18/1607 174/265 |
| 2010/0118502 A1* | 5/2010 | Inagaki .................. | H01G 4/224 361/766 |
| 2011/0154661 A1* | 6/2011 | Park ........................ | H05K 3/321 29/846 |
| 2012/0000068 A1* | 1/2012 | Sakamoto ........... | H01L 21/4846 29/852 |
| 2016/0212859 A1* | 7/2016 | Bellaiche ............... | H05K 1/097 |

* cited by examiner

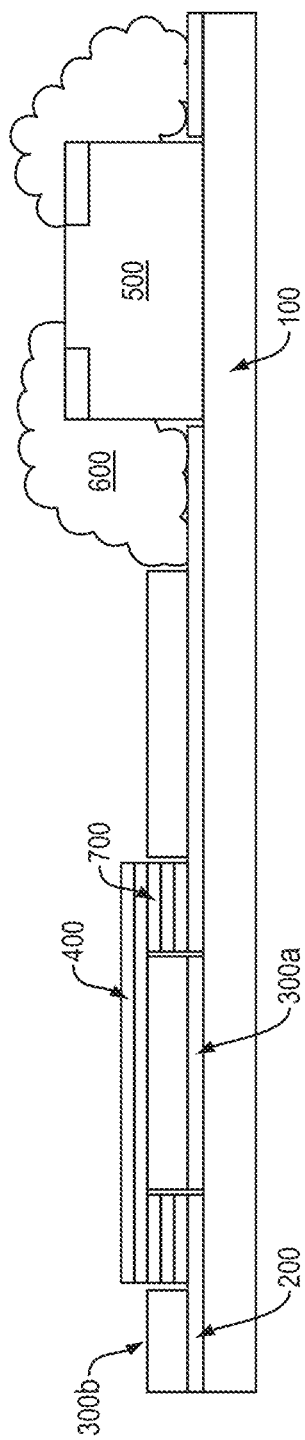
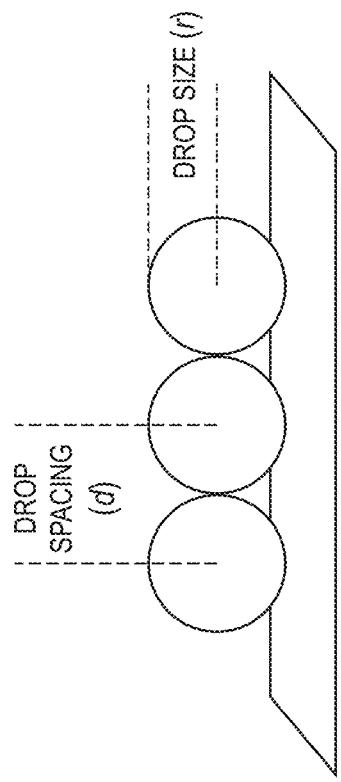

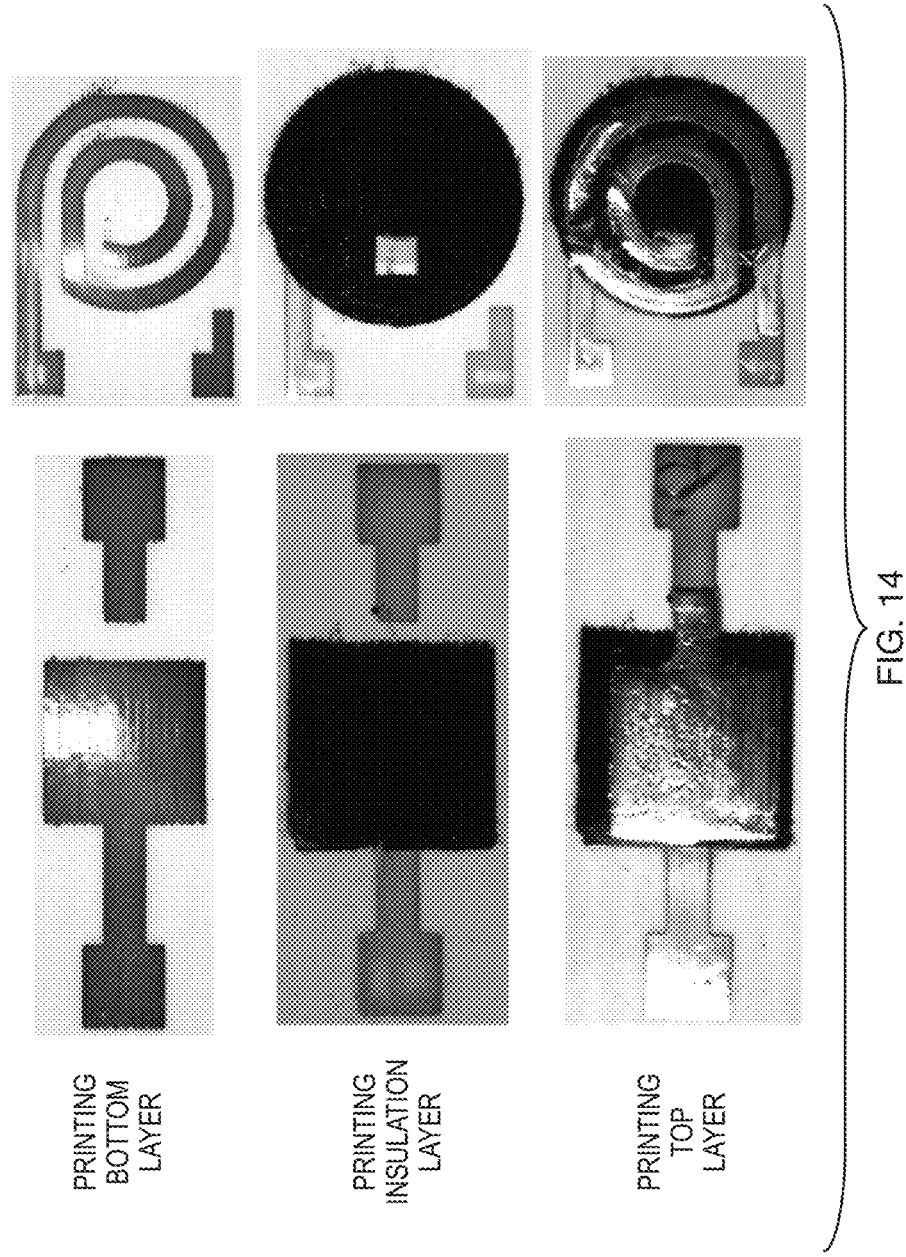

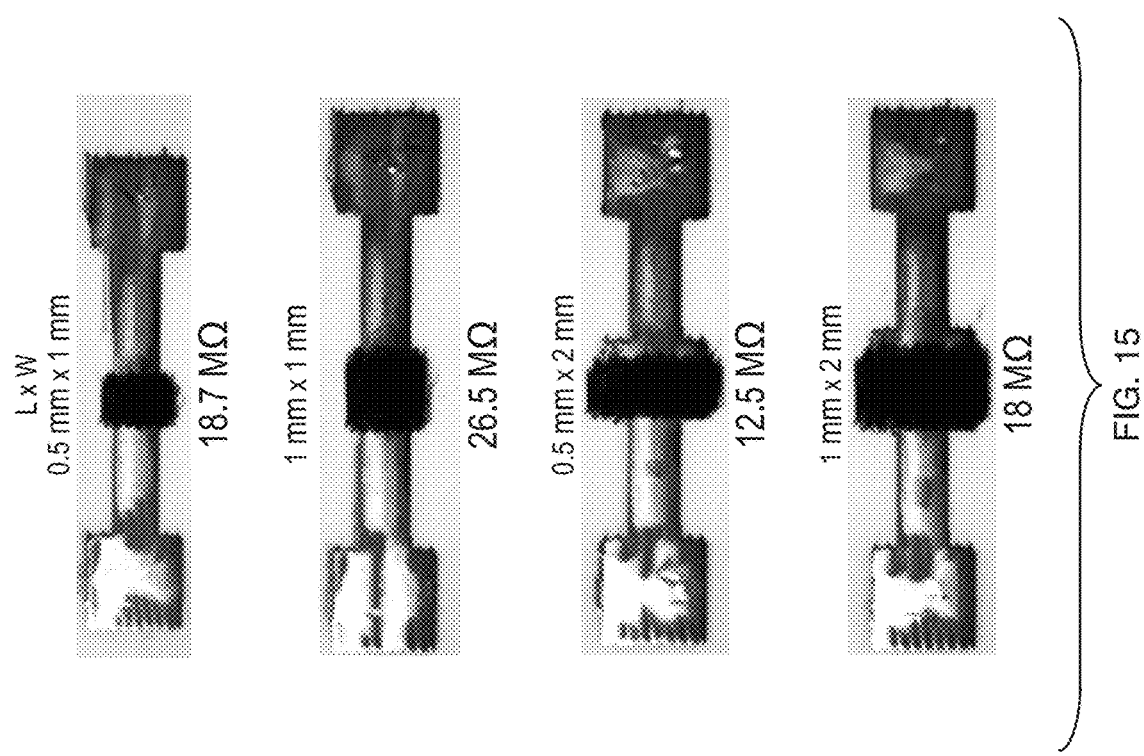

MULTILAYER ADDITIVE PRINTED CIRCUIT

BACKGROUND

Field of the Disclosure

The present disclosure relates to multilayer additive printed circuits, and more particularly, to a thin-film multilayer additive printed circuit fabrication process with an ink-jet printer capable of being printed on a planar flexible substrate in one or multiple layers while decreasing manufacturing costs thereof.

Description of the Related Art

As is known in the art, printed circuit boards (PCB) electrically connect components using conductive features laminated onto a substrate. Traditionally, the substrate is rigid and is thus limited in application as it is not applicable to wearable or implantable devices. Recently, printed circuit boards have been manufactured through additive processes to resolve difficulties presented in subtractive manufacturing. In subtractive manufacturing, the copper clad surface is etched away to form conductive traces. Conversely, in additive manufacturing, the circuit is built up on a base material by adding another material layer which provides improved efficiency and lower waste in manufacturing process.

In particular, additive processes include introducing a material to an assembly and allowing the material to be imaged and such a process allows for the development of electronic circuits on various non-traditional substrates such as flexible, biocompatible, and biodegradable materials. The PCBs in the related art that are developed on such non-traditional substrates are, however, limited to few layers with high thickness which also limits the flexibility and usability thereof.

In addition, additive processing can be utilized to fabricate various types of electronic components. There is a very limited prior art regarding this new fabrication technique. As most additive manufacturing processes lead to thicker layers, fabrication of electronic components is not practical with those fabrication processes.

The above information disclosed in this section is merely for enhancement of understanding of the background of the disclosure and therefore maintain only contained information that does not form the prior art that is already known to a person of ordinary skill in the art.

SUMMARY

The present disclosure provides a multilayer printed circuit or a multilayer printed circuit board (PCB) as well as several other passive and active electronic components which is capable of being printed on a flexible substrate in multiple layers separated by printed insulation layers to develop a more complex multilayer printed circuit that may be applicable with various discrete electronic components or integrated circuits on the printed circuit within the same monolithic fabrication process.

In one aspect, according to an exemplary embodiment of the disclosure, provided is a multilayer printed circuit, which may include: a substrate; a first conductive layer printed with conductive ink on the substrate; one or more insulation layers having a uniform thickness printed on the first conductive layer and the substrate, less via cavities, test point cavities, and a surface mount component contact point and mounting cavities; and a second conductive layer printed on the vias and over the insulation layer. The vias may be printed with conductive ink inside of the via cavities, and in particular, the insulation layer, vias, and conductive layers may be repeatedly printed in sequence to form the multilayer printed circuit. Alternately, the insulation layer, vias, and conductive layers may be repeatedly printed in sequence to form a multilayer printed circuit board (PCB).

The insulation layer may be printed on either the first conductive layer or the substrate. The insulation layer may comprise two or more insulation material coatings printed on the first conductive layer and the substrate and may comprise at least one selected from the group consisting of: copper oxide nanoparticles, ceramic nanoparticles, pyrrole, polydimethylsiloxane (PDMS), polyimide, polysaccharides, chitosan, printable dielectric materials, and mixtures thereof. For instance, one of the coatings of the insulation layer may comprise a pyrrole insulation coating printed.

An electronic component may be attached at the surface mount cavity and may be attached to the first conductive layer by printing with a conductive ink, soldering, or silver epoxy.

The first conductive layer may have a thickness ranging from about 250 nm to about 500 nm, and may comprise at least one selected from the group consisting of silver nanoparticles, copper nanoparticles, gold nanoparticles, nickel nanoparticles, carbon nanotubes, graphene, polypyrrole, and mixtures thereof. In addition, the second conductive layer may comprise at least one selected from the group consisting of silver nanoparticles, copper nanoparticles, gold nanoparticles, nickel nanoparticles, carbon nanotubes, graphene, polypyrrole, and mixtures thereof. The first conductive layer and the second conductive layer may comprise silver nanoparticles having an average size of about 50 nm to 200 nm. The second conductive layer and the vias are printed in a single coating or multiple coatings.

The substrate may be flexible and may have a thickness ranging from about 100 μm to about 5 mm. The substrate may be at least one selected from the group consisting of: a flexible paper, polymer film, glass, fabric, metal foil, and biological thin film. material. Alternately, the substrate may be a biodegradable or biocompatible polymer film.

The vias may include a surrounding overflow region, and an area of the surrounding overflow region may be less than about 10% of an area of the vias.

The first conductive layer may form a trace and the trace has a width ranges from about 1 μm to about 50 cm.

In another aspect, according to an exemplar embodiment of the present disclosure, provided is a method of producing a multilayer printed circuit. The method may include: printing a first conductive layer on a substrate; printing an insulation layer having a uniform thickness on the first conductive layer and the substrate, less via cavities, test point cavities, and a surface mount component contact point, and mounting cavities; printing a second conductive layer on the vias and over the insulation layer; repeatedly printing the insulation layer, the vias, and the conductive layers, in sequence, to form the multilayer printed circuit; and printing a top coating layer on the insulation layer and the second conductive layer. In particular, the vias may be printed with conductive ink inside of the via cavities.

The insulation layer, the vias, and the conductive layers may be repeatedly printed in sequence to form a multilayer printed circuit board (PCB).

The insulation layer may be printed on either the first conductive layer of the substrate.

The method may further comprise printing two or more insulation material coatings for the insulation layer on the substrate. One of the coatings of the insulation layer may be a pyrrole insulation coating printed.

An electronic component may be attached at the surface mount contact point and may be attached to the first or the second conductive layer by printing with a conductive ink, soldering or silver epoxy.

The first and second conductive layers have about the same thickness, and the thickness ranges from about 250 nm to about 500 nm. The first conductive layer, the insulation layer, the second conductive layer and the vias are printed in multiple coatings.

An ink composition for printing the first conductive layer, or the second conductive layer may comprise an amount of about 30-50 wt % of silver nanoparticles having an average size of about 50 nm to 200 nm, based on the total weight of the ink composition, and the ink composition has a viscosity of about 1 to 100 cPa. A drop spacing for printing of the first conductive layer, the insulation layer, the second conductive layer and the top coating layer may be of about 10 μm to 100 μm. A drop rate for each printing of the first conductive layer, the insulation layer, the second layer and the top coating layer may be of about 5 kHz to 50 kHz.

The insulation layer, the vias, and the conductive layers may be repeatedly printed in sequence to formelectronic components. The electronic components may be active or passive components or a combination thereof. For instance, the passive components may be at least one selected from the group consisting of: resistors, capacitors, and inductors. Additionally, the active components may be at least one selected from the group consisting of: diodes, transistors, liquid emitting diodes (LEDs), photo-sensors, and solar cells.

The insulation layer, the vias, and the conductive layers may be repeatedly printed in sequence to form electronic circuits or systems using a same monolithic additive fabrication process. The additive printed layers may be at least one selected from the group consisting of: low-conductivity polymers, semi-conductive polymers, electron donors, and electron acceptors.

For some substrates and inks, a special curing process called sintering might be needed. This process is utilized to improve conductivity and improve bonding of the molecules of the printed traces, as well as improved adherence of the printed trace with the layer underneath.

Other aspects of the disclosure are discussed infra.

BRIEF DESCRIPTION OF THE DRAWINGS

The disclosure will hereinafter be described with reference to the accompanying drawings, wherein like reference numerals denote like elements, and:

FIG. 1A is a diagram illustrating cross section of a multilayer additive PCB according to an exemplary embodiment of the present disclosure;

FIG. 1B is a diagram illustrating the relationship between the drop spacing and drop size of the additive printing process according to an exemplary embodiment of the present disclosure;

FIG. 14 illustrates process steps and prototypes of printed capacitor (left) and printed inductor (right) that utilizes a printed conductive layer, a printed insulating layer, and another printed conductive layer; and FIG. 15 illustrates examples of fabricated resistor prototypes that utilize a printed conductive layer and a printed high-resistivity polymer layer.

DETAILED DESCRIPTION

Figure 2D:
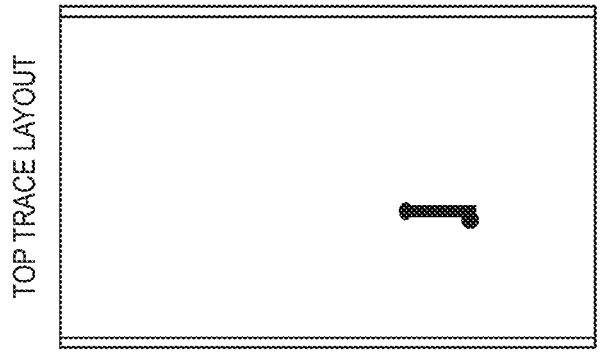
FIGS. 2A-2D illustrate layouts of various layers of the multilayer additive PCB according to an exemplary embodiment of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter reference will now be made in detail to various exemplary embodiments of the present disclosure, examples of which are illustrated in the accompanying drawing and described below. While the disclosure will be described in conjunction with exemplary embodiments, it will be understood that the present description is not intended to limit the disclosure to those exemplary embodiments. On the contrary, the disclosure is intended to cover not only the exemplary embodiments, but also various alternatives, modifications, equivalents and other embodiments, which may be included within the spirit and scope of the disclosure as defined by the appended claims.

The exemplary embodiments described herein below provide a multilayer additive printed circuit board formed using an inkjet printing technique. The inkjet printing allows for low temperature thin film depositions on planar substrates. In particular, the technique images a digital graphic or pattern generated by a computer medium by propelling ink droplets onto a substrate, such as, paper, plastic, or the like. Additionally, various printing materials may be used, as being suspended in a suitable medium capable of maintaining the viscosity for printing. For example, the ink may be silver nanoparticle based to print conductive traces on the substrate. Various print heads may also be used in this technique, including, syringe, piezoelectric crystal, microelectromechanical system (MEMS) based device, etc. Then, upon curing, the medium is capable of evaporating the substrate to form the desired pattern or graphic of the printed circuit or PCB.

In one aspect, the present invention provides, as shown in FIG. 1A, a multilayer printed circuit board (PCB) that includes: a substrate 100; a first conductive layer 200 printed with conductive ink on the substrate; one or more insulation layers 300a, 300b having a uniform thickness printed on the first conductive layer and the substrate, less via cavities, test point cavities, and a surface mount component contact point and mounting cavities; and a second conductive layer 400 printed on the vias and over the insulation layer. In particular, the vias may be printed with conductive ink inside of the via cavities. In addition, the insulation layer, vias, and conductive layers may be repeatedly printed in sequence to form the multilayer PCB. Further, an electronic component 500 may be attached at the surface mount contact point and may be attached to the first or the second conductive layer by printing with a conductive ink, soldering or silver epoxy 600.

The term "layer" as used herein refers to a (usually planar) deposition of PCB pattern corresponding to a single PCB layer design. A layer may have one or multiple coatings of the same or different materials with the same or similar electronic properties. The term "coating" as used herein, refers to a single deposition printed in a single printing process. Multiple coating of same or similar (electronic property-wise) material corresponding to the same PCB layer design may be printed to increase height (thickness), to decrease resistivity of the layer, or to align two layers at the same top planar height.

Figure 2C:
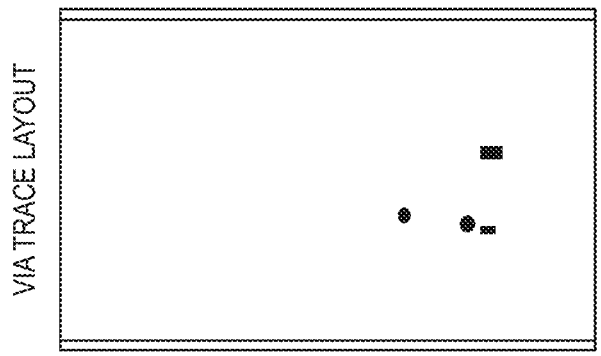
Figure 2B:
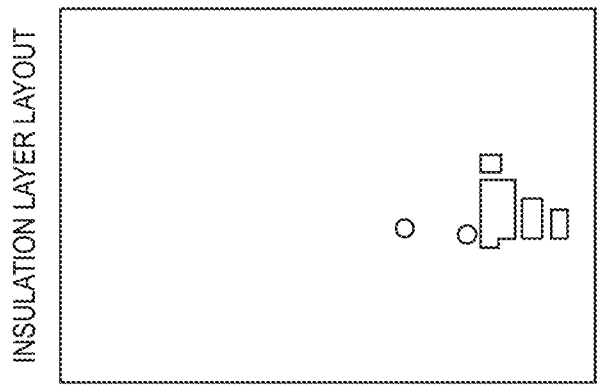
Figure 2A:
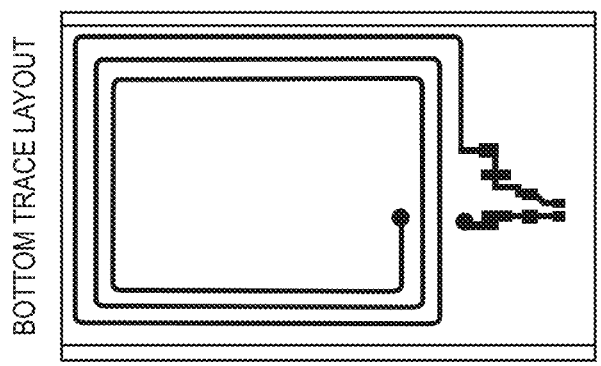
Figure 3B:
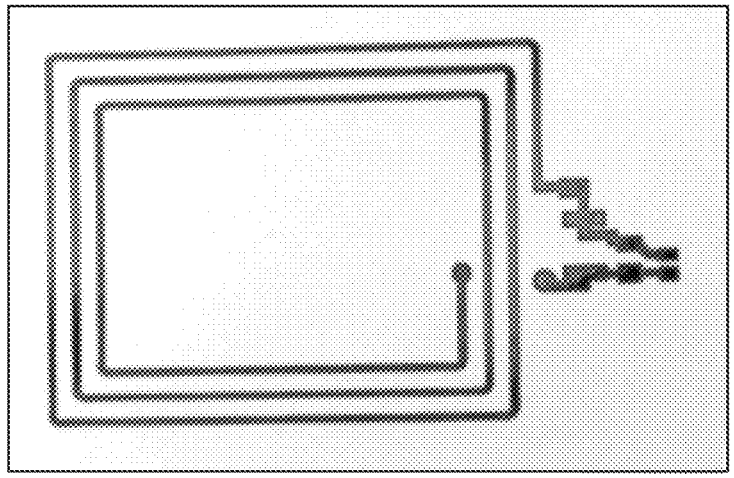
FIGS. 3A-3B illustrate printed bottom traces on a substrate according to an exemplary embodiment of the present disclosure.
Figure 3A:
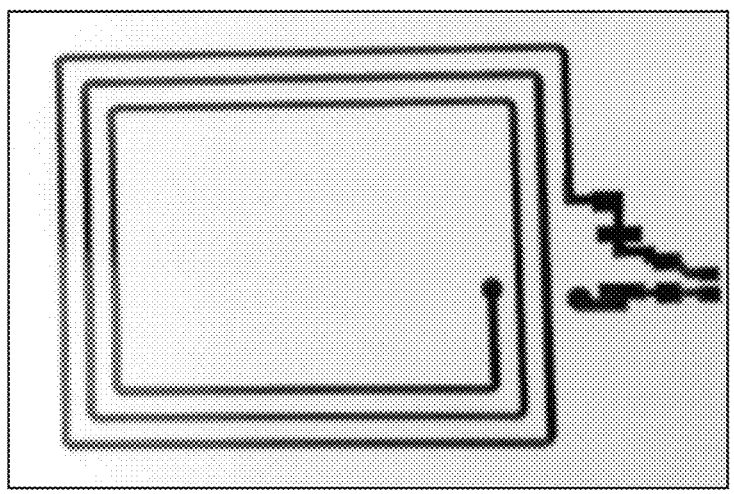

The layers may be printed or coated by printing process until desired thickness thereof is obtained, or until sufficient surfacial condition is obtained, or until sufficient conductivity or insulating property is obtained, however, a number of coatings or printing processes is not particularly limited. FIGS. 2A-2D show various trace layouts of the different layers of the PCB for an illustrative example of the printing process and functional testing. In particular, FIG. 2A illustrates the bottom trace layout, FIG. 2B illustrates the insulation layer, FIG. 2C, illustrates the via trace, and FIG. 2D illustrates a top trace layout, all which are printed onto the substrate. Additionally FIGS. 3A-3B illustrate the printed bottom trace on a paper substrate.

Further, the vias provide an electrical connection between the layers in the circuit and may be printed on corresponding sides of the via cavity which may be determined or designed based on the circuit construction. The via may be printed in multiple coatings to align same top planar height with the insulation layer or to be about the same thickness as the insulation layer which may be printed to fill the via cavity. In particular, this layer within the via cavity may be printed with a gradually increase in size to correspond to the cavity size to minimize a gap at the top of the vias with the insulation layer.

Figure 4:
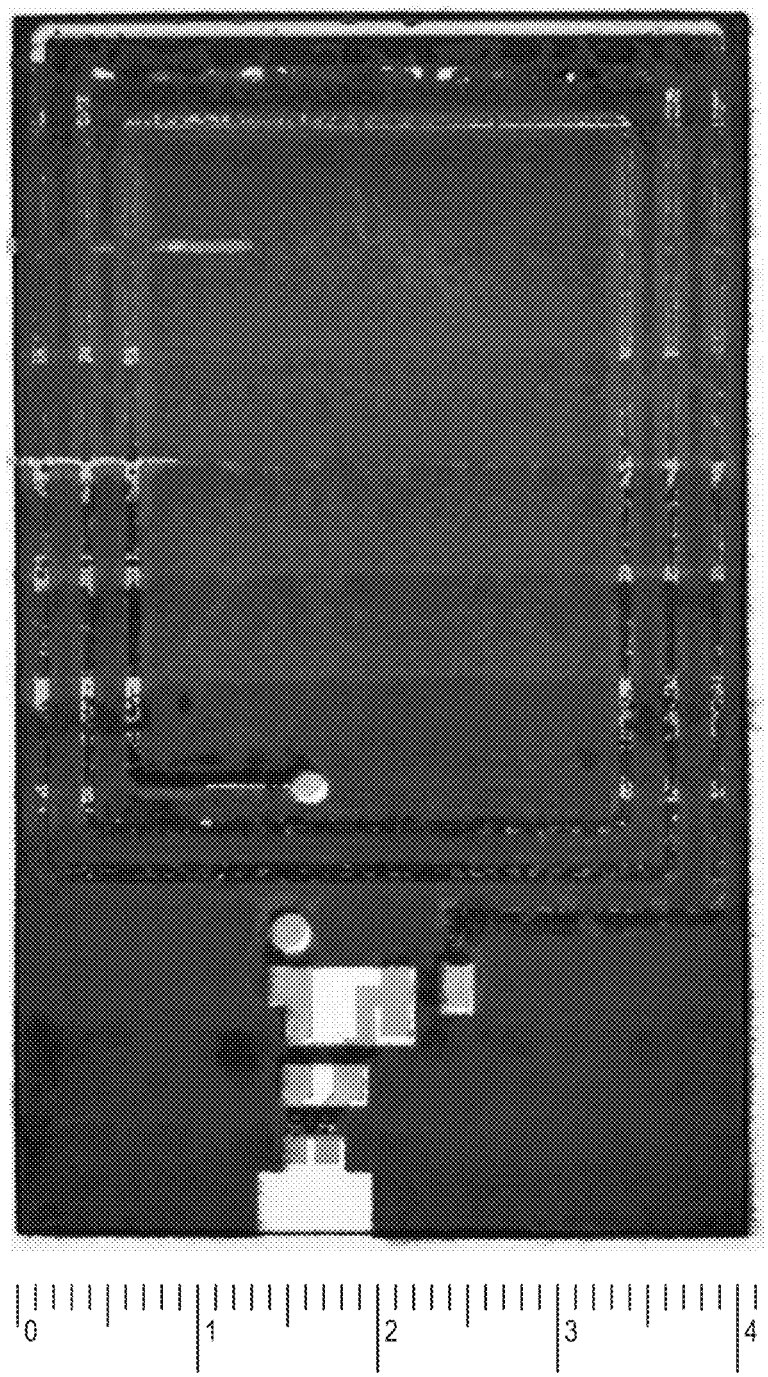
FIG. 4 illustrates an insulation layer applied over the complete layout of the printed bottom layer less vias according to an exemplary embodiment of the present disclosure.
Figure 5:
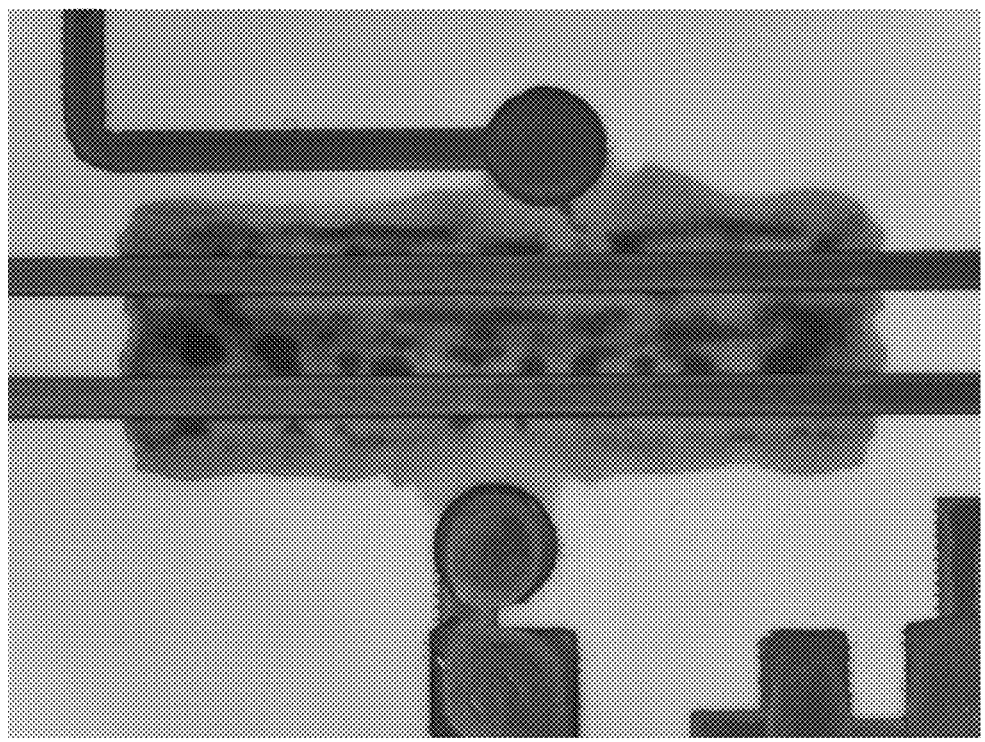
FIG. 5 illustrates a partial insulation layer applied only at an overlap region of the bottom trace and top trace according to an exemplary embodiment of the present disclosure.

Additionally, as illustrated in FIG. 4, the insulation layer may be printed on the substrate (e.g., the complete layout of the printed bottom layer) less the vias and the surface mount cavity to which a component may be attached. The insulation layer may have a substantially uniform thickness achieved by fine tuning a drop rate of ink. In particular, the deposition rate of the ink may be from about 5 kHz to 25 kHz that controls the drop size (r) as shown in FIG. 1B. Additionally, the drop spacing (d), as shown in FIG. 1B, may be controlled from the printer, to be maintained at about 15 μm by varying a printer resolution (e.g., to about 1693 dpi) for the provided illustrative example, but the present disclosure is not limited thereto and other control parameters may be used. When the drop ink rate is less than 5 kHz, a bottom trace layer may peel due to possible tensile strength mismatch of overlapping thin films. When the drop rate is greater than 25 kHz, the printing may provide gaps between scans of printing process, however for various materials, rate up to 50 kHz might be usable. In addition, a higher drop rate reduces the drop size of the printed layer that results in lower irregularity of the layer required to produce a smooth planar top surface. On the other hand, a smaller drop rate increases drop size of the printed layer that results in higher irregularity of the layer while producing a thicker layer in single coating of the printing process. The insulation may specifically be multiple coatings of the same or a combination of different insulating materials, such as a pyrrole insulation coating and a copper oxide insulation coating is used in the illustrative examples as depicted in FIG. 1A. The insulation layer may cover the complete substrate, less via cavities, test point cavities, and a surface mount component contact point and mounting cavities, as shown in FIG. 4, or only the overlap regions of the bottom trace with surrounding substrate, as show in FIG. 5, where the pyrrole insulation coating is applied at the overlap region of the bottom trace and top trace.

The vias may also include an overflow region outside of each via. For example, the overflow region may be about 10% of the vias to thus reduce the flow of ink fluid in the vias caused by random Brownian motion of the ink fluid when printed. In addition, the insulation layer may have uniform densities throughout the layer and an even surface. The insulation layer may have a thickness of less than about 10 μm, less than about 5 μm, less than about 4 μm, less than about 3 μm, or less than about 2 μm, or particularly have a thickness of about 1 μm.

Figure 6:
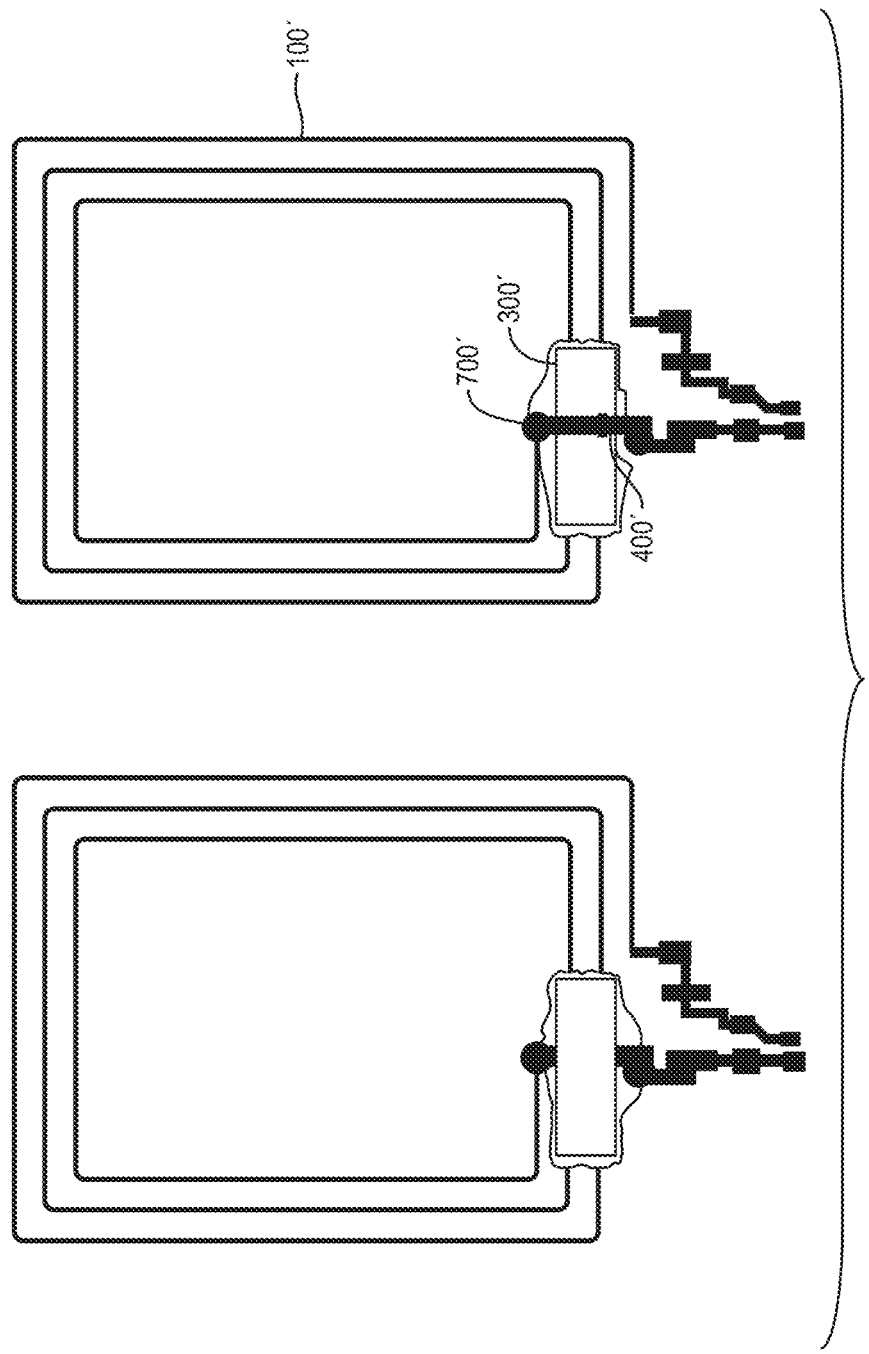
FIG. 6 illustrates a pair of printed prototypes with two-layer additive printed trace according to an exemplary embodiment of the present disclosure.

Moreover, as shown in FIG. 6, a second conductive layer may be printed on the vias as single or in multiple coatings, based on the desired thickness. In addition to a bottom printed trace or a first conductive layer (100'), the second conductive layer (400') may be printed on a via (700) to have about the same thickness of the first discussed insulating layer (300'). Alternatively, the second conductive layer may be formed by multiple print coatings to reduce the trace resistivity or to ensure trace connectivity or a combination thereof. Likewise, the second conductive layer may have uniform densities throughout the layer and an even surface. Further, the second conductive layer may have a thickness less than about 1 μm, less than about 900 nm, less than about 800 nm, less than about 700 nm, less than about 600 nm, less than about 500 nm, or less than about 400 nm, or particularly have a thickness ranging from about 250 nm to 350 nm.

In certain exemplary embodiments, the multilayer PCB may further include a top coating of the insulation layer (FIG. 6). The top coating may be the same or different from the insulation layer. In particular, the top coating layer may also be printed on the second conductive layer and the insulation layer. The top coating may be printed to minimize irregularity of the top surface using ink having small non-conductive particles due to separate printing processes for the insulation layers and the second conductive layers, that is, the top coating layer may contribute to a more uniform surface of the insulation layer that is required for good electrical connectivity of the second conductive layer. Exemplary compositions for this top coating comprise non-conductive nanoparticles. The non-conductive nanoparticles as used herein may be copper oxide nanoparticles.

The conductive material included in the conductive layers or top coating layers may be silver nanoparticles. The silver nanoparticles as used herein may comprise substantially homogeneous silver and other silver compounds, such as silver oxide. The silver nanoparticles may have an average size of less than about 500 nm, less than about 400 nm, less than about 300 nm, less than about 250 nm, or less than about 200 nm, or may have an average size ranging from about 50 nm to 200 nm.

In particular exemplary embodiments, the silver nanoparticles included in the conductive layers such as the first conductive layer, or the second conductive layers may have an average size of about 85 nm to 115 nm, without particular size distribution thereof. The silver nanoparticles may also be aggregated or may form particulates without particular limitations to size or volume. Preferably, the silver nanoparticles may be uniformly dispersed or distributed throughout the conductive layers, thereby forming a substantially uniform thickness. Each conductive layer of the invention may contain substantially homogenous composition, for instance, the conductive layers as printed on the multilayer PCB may contain greater than about 10 wt %, greater than about 20 wt %, greater than about 30 wt %, greater than about 40 wt %, greater than about 50 wt %, greater than about 60 wt %, or greater than about 70 wt % of silver nanoparticles, based on the total weight of the conductive layer.

Further, the insulation layer may comprise insulating materials that do not transfer electrons and have high resistance to electric current. The insulation layer may comprise two or more insulation materials printed on the first conductive layer and the substrate. Exemplary insulation materials may include, but not limited to, at least one selected from the group consisting of: copper oxide nanoparticles, ceramic nanoparticles, pyrrole, polydimethylsiloxane (PDMS), polyimide, polysaccharides, chitosan, printable dielectric materials, and mixtures thereof. Preferably, those insulating material may exist in forms of nanoparticles.

In addition, the insulation layer may include the insulation coating comprising substantially homogeneous copper oxide nanoparticles. The copper oxide nanoparticles may have an average size of less than about 500 nm, less than about 400 nm, less than about 300 nm, less than about 250 nm, or less than 200 nm, or particularly have an average size ranging from about 50 nm to about 200 nm. In particular exemplary embodiments, the copper oxide nanoparticles included in the insulating layer top coating of the invention may have an average size of about 85 nm to 115 nm, without limiting size distribution thereof. The copper oxide nanoparticles may also be aggregated or may form particulates without particular limitations to size or volume thereof.

Preferably, the copper oxide nanoparticles may be uniformly dispersed or distributed throughout the top coating of the insulation layer, thereby forming a substantially uniform thickness and forming a smooth and uniform top surface of the insulation layer. The insulation layer of the invention may contain substantially homogenous composition, for instance, the non-conductive layers as printed on the multilayer PCB may contain greater than about 10 wt %, greater than about 20 wt %, greater than about 30 wt %, greater than about 40 wt %, greater than about 50 wt %, greater than about 60 wt %, or greater than about 70 wt % of copper oxide nanoparticles.

In another exemplary embodiment, the insulation layer printed on the first conductive layer or the substrate, less via cavities, test point cavities, and a surface mount component contact point and mounting cavities, as discussed above may include a polymer insulation coating. The polymer insulation coating may comprise other polymeric insulating material, such as pyrrole, poly acetylene, and the like. In particular exemplary embodiment, the polymer insulation coating may be pyrrole. Since the oxidized or doped pyrroles or polypyrroles have electron conductivity, the pyrroles generally used in the present invention is undoped otherwise chemically non-reactive form (e.g. non-oxidized form). Preferably, the pyrrole insulation coating in the invention may contain substantially homogenous composition, for instance, the pyrrole insulation coating may contain greater than about 50 wt %, greater than about 60 wt %, greater than about 70 wt %, greater than about 80 wt %, greater than about 90 wt %, greater than about 95 wt %, or greater than about 99 wt % of undoped pyrroles or polymers thereof.

Furthermore, the substrate may be flexible and may have a thickness ranging from about 100 µm to 5 mm. For example, the substrate may be a flexible paper, polymer film, glass, fabric, metal foil, biological thin film material, and the like. In particular exemplary embodiments, the substrate may be made of a biodegradable or biocompatible polymer film. The "biodegradable" polymer as used herein refers to a polymer material that may be decomposed by biological means, for example, by bacteria, fungi, and other microorganism either in natural or artificial condition. The "biocompatible" polymer as used herein refers to a polymer material that may interact or perform as being attached, integrated, or transplanted in animals, particularly a human body, without causing serious damage, decomposing, wound, inflammation, immune response, and the like. As such, the substrate of the invention may be suitably attached, disposed or transplanted to human bodies. In other words, once the various layers are printed, the polymer or substrate may break down or dissolve to result in merely the PCB.

In certain exemplary embodiments, the first conductive layer may have a thickness less than about 500 nm, less than about 450 nm, less than about 400 nm, or less than about 350 nm, or may have an average size ranging from about 250 nm to 350 nm. In addition, the first conductive layer may form a trace according to a design or pattern of the electric circuits and the trace may have a width range of less than about 5 cm, less than about 1 cm, less than about 1 mm, less than about 100 µm, or less than about 20 µm, or may have an average width ranging from about 20 µm to 1 cm. Alternatively, the trace width for electrically conductive silver nanoparticle thin films may be in a range of about 100 µm to 500 µm.

Figure 10:
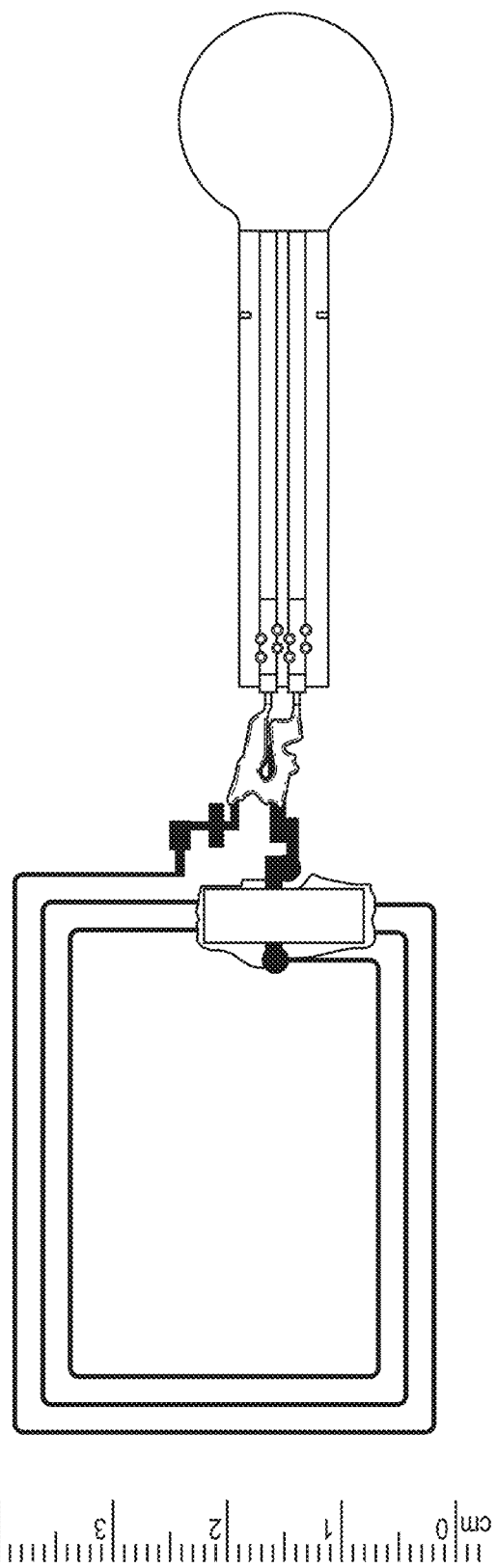
FIG. 10 illustrates the complete sensor with the multilayer PCB according to an exemplary embodiment of the present disclosure.

Once the printed circuit has been printed, various discrete electronic components may be connected to the conductive trace of the circuit at the component mounting cavities via the surface mount component contact point, as shown in FIG. 10. In particular, the discrete electronic components may be attached by low temperature silver epoxy, reflow soldering, or another suitable attaching method including printed conductive ink. The curing temperature of the ink and component attachment technique may be considered based on the temperature allowed by the substrate and the other layers printed on the substrate to prevent inadvertent dissolving of the layers.

Hereinbelow a method of forming a multilayer printed circuit board will be described in detail.

In one aspect of the present invention, a method of producing a multilayer printing circuit as described above may include: printing a first conductive layer on a substrate; and printing an insulation layer having a uniform thickness on the first conductive layer and the substrate, less via cavities, test point cavities, and a surface mount component contact point, and mounting cavities; printing a second conductive layer on the vias and over the insulation layer; repeatedly printing the insulation layer, the vias, and the conductive layers, in sequence, to form the multilayer printed circuit; and printing a top coating layer on the insulation layer for smooth top surface required for the second conductive layer. In particular, the vias may be printed with conductive ink inside of the via cavities. Likewise, the insulation layer, vias, and conductive layers may be repeatedly printed in sequence to form a multilayer printed circuit board (PCB) or to form electronic components.

Figure 7:
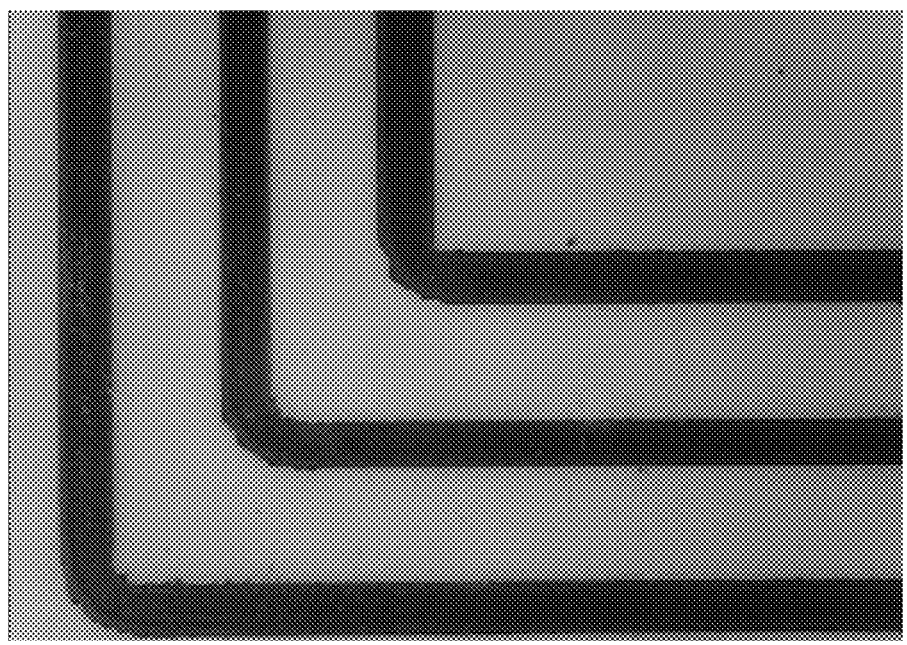
FIG. 7 illustrates a corner trace printed with an inkjet printer according to an exemplary embodiment of the present disclosure.

As discussed above, an inkjet printing technique may be used for producing the multilayer printing circuit. The inkjet printing may use suspended ink components such as nanoparticles as described herein in a medium or solvent, such that the ink may maintain the viscosity required for printing. For example, the medium evaporates the substrate leaving the printed material on the substrate in the desired pattern, as shown in FIG. 6. Depending on a variety of desired characteristics, the loading of print material in the ink may typically vary from very low (e.g., 20%) to very high (e.g., 70%). Additionally, FIG. 7 shows a detailed view of the trace that is printed using the inkjet printing technique.

Furthermore, the method may include printing another insulation layer on the substrate, and the other insulation layer may suitably comprise a pyrrole insulation coating. The first conductive layer, the insulation layer, the top coating layer, the second conductive layer, and the additional insulation layer (e.g. a pyrrole insulation coating) may be understood in the light of the descriptions presented above.

The second conductive layer printed on the vias may be printed in multiple coatings. For instance, the vias may be printed with conductive ink in multiple coatings to increase the height of the conductive material to have at least approximately or the same height or thickness as the insulation layer. In addition, the conductive coatings in the vias may be printed at the cavity in a gradually larger size matching the cavity size to reduce gap of the deposited second conductive layer at the top of the vias with the insulation layer.

Figure 8A:
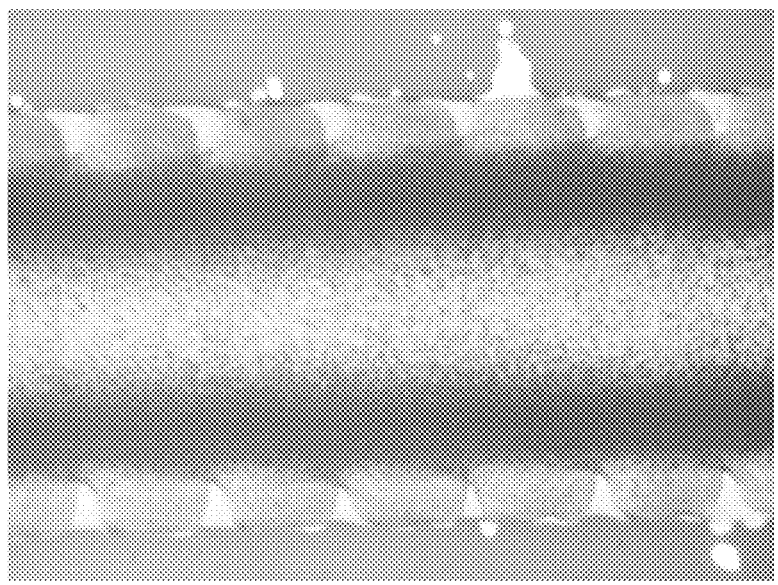
FIGS. 8A-8B are optical images of a silver trace showing characteristics of an inkjet printed trace according to an exemplary embodiment of the present disclosure.
Figure 8B:
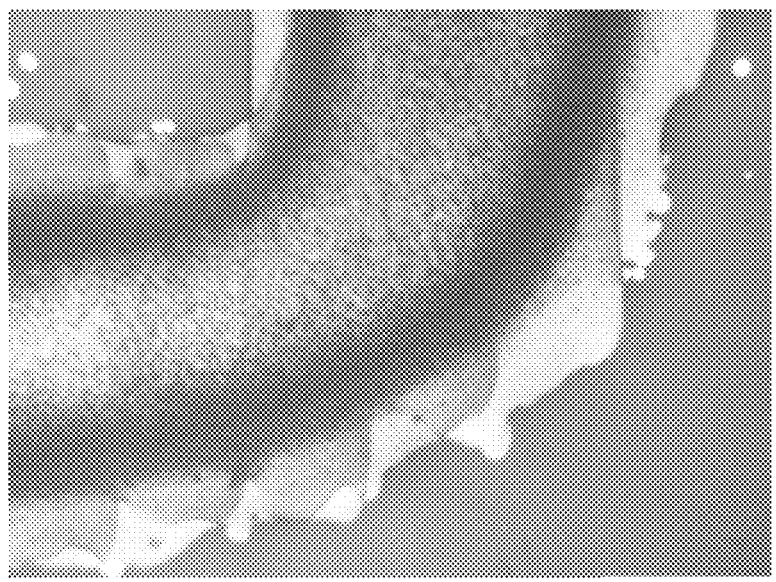

In certain exemplary embodiments, an ink composition for printing, for example, inkjet printing, the first conductive layer, the second conductive layer, and the top coating layer may comprise an amount of about 30-50 wt % of nanoparticles based on the total weight of the ink composition. The silver nanoparticles, for example, may have an average size of about 85 nm to 115 nm. FIGS. 8A and 8B illustrate a silver nanoparticle trace formed by the printing of these various layers as observed through an optical microscope. For example, the figures illustrate the serrated edges that are formed using this additive printing technique. Additionally, the ink composition may further comprise a suitable solvent or medium which disperses the nanoparticles and other chemical components uniformly. Exemplary solvent or medium may include ethanol, acetone, di-water, dimethylformamide, tetrahydrofuran, or Glycol. In addition, the ink composition for printing the first conductive layer, the second conductive layer, and the top coating layer may be prepared to have a viscosity of about 1 to 100 cPa.

Figure 9A:
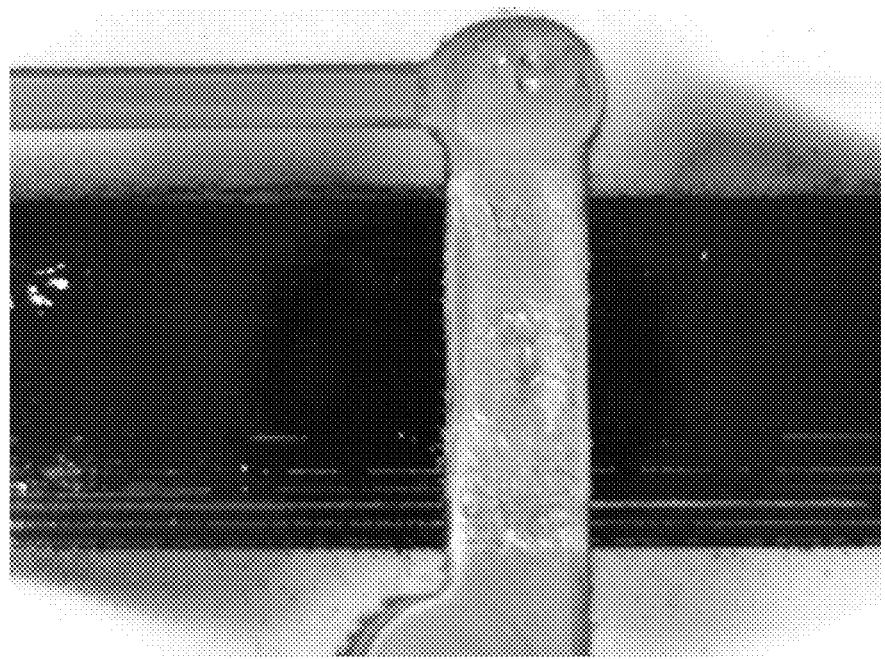
FIGS. 9A-9B are optical images of first and second layer silver nanoparticle traces and an insulation layer according to an exemplary embodiment of the present disclosure.
Figure 9B:
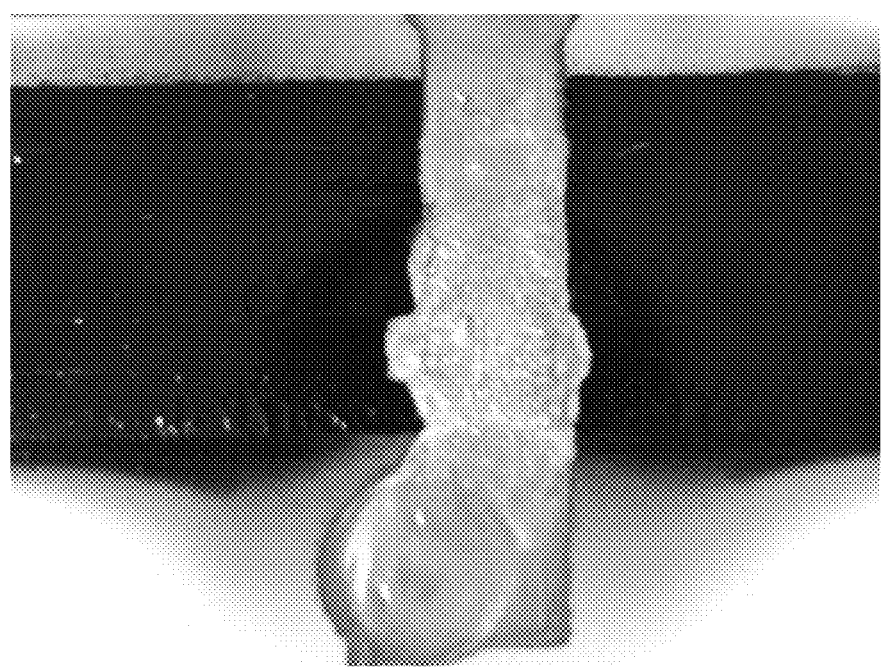

Further, the ink composition for printing the insulation layer may comprise an amount of about 30-50 wt % of nanoparticles based on the total weight of the ink composition. The copper oxide nanoparticles, for example, may have an average size of about 85 nm to 115 nm. The ink composition may further comprise suitable solvent or medium which disperses the nanoparticles and other chemical components uniformly. Exemplary solvent or medium may include ethanol, acetone, di-water, dimethylformamide, tetrahydrofuran, or Glycol. In addition, the ink composition for printing the insulation layer may be prepared to have a viscosity of about 1 to 100 cPa. FIGS. 9A and 9B show images of two prototypes depicting the first (horizontal) and second (vertical) conductive layers having silver nanoparticle traces together with the insulation layer in between the two conductive layers.

In certain exemplary embodiments, the inkjet printing technique may select the same or different medium for ink compositions of each layer. However, in particular, when a suspending medium in the ink composition of the additive or later printed layer dissolves the previously printed layer, the particular suspending medium should be avoided. In addition, the ink composition may include suitable suspending medium to obtain a desired thickness of the layers, instead of applying individual thick coating, for example, by printing single or multiple coating processes at higher drop rates. The medium in the ink compositions may be evaporated after printing and upon curing, thus only the printed materials such as silver nanoparticles or copper oxide nanoparticles may remain in the desired patterns.

A drop rate of the ink for each printing (e.g., inkjet printing) the first conductive layer, the insulation layer, the second layer and the top coating layer may be of about 5 kHz to 50 kHz. The drop rate of the ink may be adjusted to control the drop size of the printed ink and obtain a smooth surface of the insulating layer.

In certain exemplary embodiments, multiple coatings of the conductive ink may be printed in the via and overflow region after the insulation layer is printed. The number of coating requirements may depend on the thickness of each coat after a curing process and the thickness of the insulation layer above the bottom printed trace. Alternatively, the vias may be printed with conductive layer to increase the height of conductive material at approximately the same as the insulation layer. In addition, the conductive layer in the vias may be printed in the cavity in a gradually larger size matching the cavity size such that the deposited material at the top of the via has minimal gap with the insulation layer.

Figure 11:
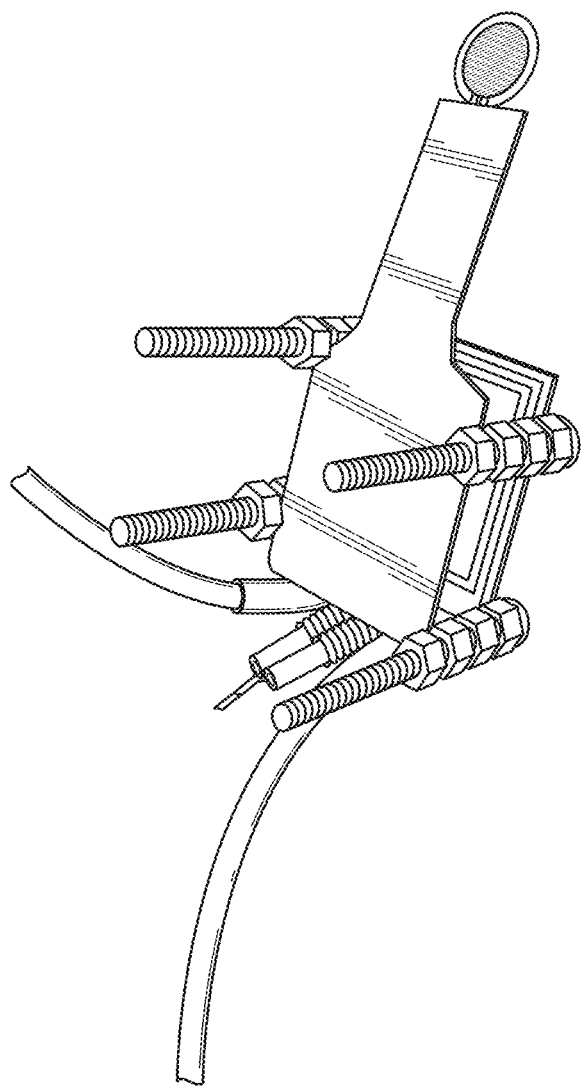
FIG. 11 illustrates an experimental setup of the additive printed multilayer PCB on paper substrate according to an exemplary embodiment of the present disclosure.

In an exemplary embodiment of the present disclosure, a sensor circuit for a resistive based wireless analog passive sensor (rWAPS) is designed on the printed circuit or PCB and the surface mount components as shown in FIG. 10. FIG. 11 shows an exemplary experimental setup wherein the top PCB (e.g., sensor) is manufactured with the additive printing technique described herein and the bottom PCB (e.g., an interrogator) is commercially fabricated. The sensor circuit may be interrogated wirelessly at about 13.7 MHz (ISM band 13.56 MHz) using a probing antenna. In particular, the sensor circuit may include an RLC circuit in which the inductor (L) is from a planar coil and the discrete capacitor (C) may determine the resonant (tune) frequency ($f_c$) for probing. The sensor circuit may also include a resistive transducer as the load resistance ($R_L$) which may be selected as the resistance correlates with a signal being measured. This type of sensor advantageously achieves battery-less operation, a low component count, rapid response time, and lower power requirement which is suitable for the additive printing technique based multilayer PCB described herein.

Figure 12:
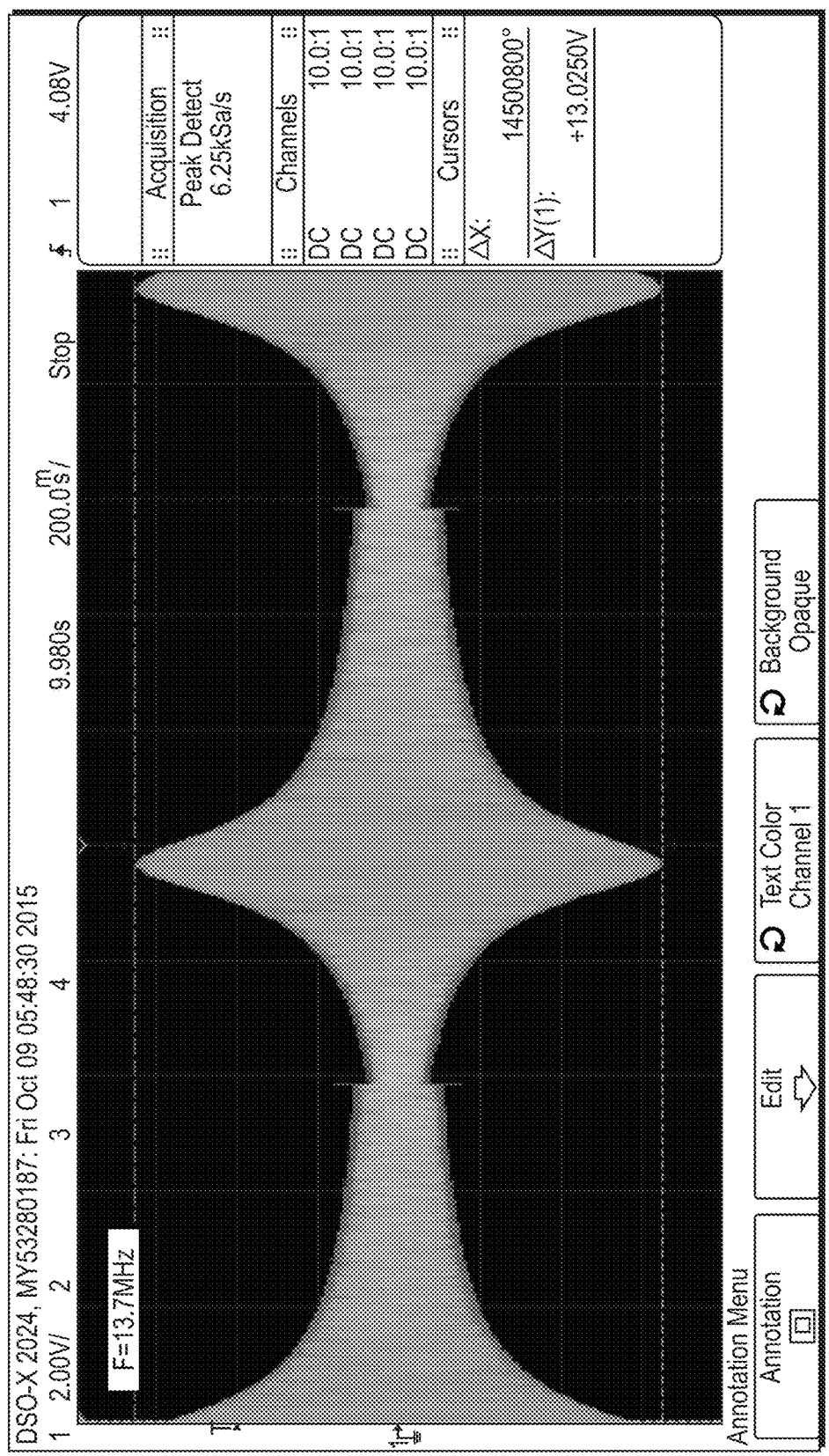
FIG. 12 illustrates a graph of a spectral scan of the fully-passive sensor according to an exemplary embodiment of the present disclosure for a tune frequency of 13.7 MHz.
Figure 13:
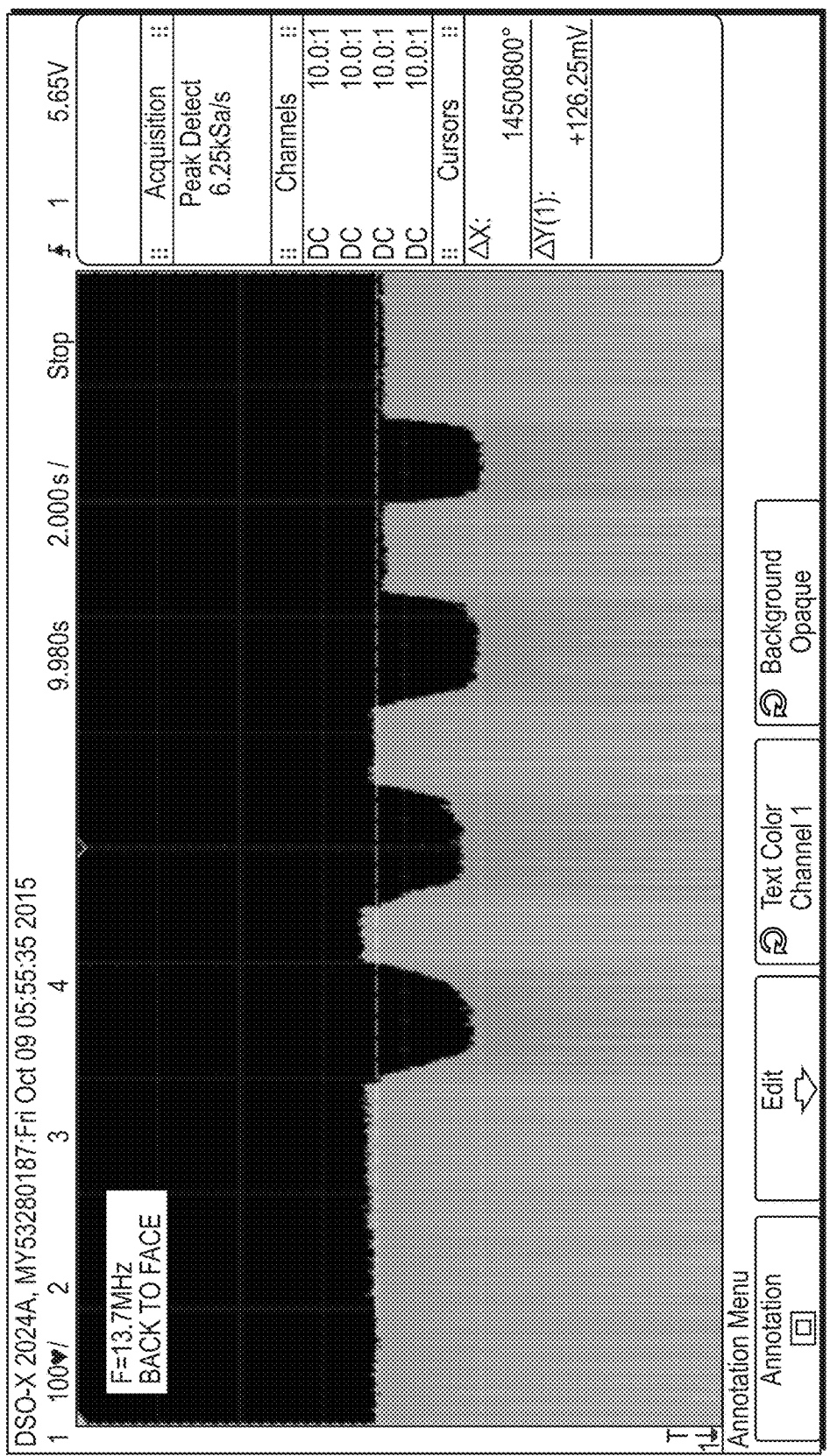
FIG. 13 illustrates a graph of a temporal scan with pressure applied on the sensor causing changes of amplitude of the receive signal.

Further, in the setup described above, a loop antenna was printed on the bottom trace showing a resistance of 50Ω and the resistivity of the top trace was substantially greater than 50Ω. The trace resistances may, however, be adjusted by manipulated printing multiple coatings of a thin overlaying film deposition after any previous insulation layer coatings have been cured. The prototype developed using this setup was formed on flexible substrates as low-cost body-worn disposable electronic patches. FIGS. 12 and 13 illustrate graphs of scans of functional testing (screenshots from the oscilloscope). In particular, FIG. 12 shows a spectral scan from 10 to 20 MHz from rWAPS interrogator for the prototyped sensor, placed at 40 mm co-axial distance, showing the prototyped sensor inductively resonating at about 13.3 MHz. Additionally, FIG. 13 shows a temporal scan at 13.3 MHz with pressure applied manually on the pressure transducer at the prototyped sensor and showing envelope modulation when the pressure is applied thereto.

Particularly, as shown in FIGS. 12 and 13, the interrogator probes remotely at about 13.65 MHz ISM band based on an inductive coupling principle and the resistive transducer at the sensor modulates at the amplitude of the reflected wave, which may be decoded with envelope detectors. The envelope of the modulated waveform correlates with the signal to be sensed. Further, functional testing was conducted in a frequency domain in which the amplitude of the carrier signal for a frequency sweep from 12 to 15 MHz peaks at 13.3 MHz for the prototyped sensor. The functionality was verified through a time domain response of amplitude modulation when a pulsating pressure was applied to the transducer and probed from a 40 mm distance. This functional verification of the printed sensor illustrates that the multilayer additive printing technology described herein is a practical technique for developing complex electronic PCBs and other passive components using the printing technology. In addition, the development of the thin film multilayer printed circuits on flexible substrates as described above coupled with the simplicity of sensor (e.g., fully passive wireless sensor) circuits further illustrates the application with wear-and-forget type body-worn wireless biosensors that may be used to routinely monitor physiological signals for various biomedical applications.

The process can be further utilized for printing of electronic components. Examples are shown in FIG. 14 where capacitor and inductor (coreless) are fabricated. In this case, a bottom printed conductive layer is fabricated with inkjet printing process. Then, an insulation layer with proper dimension is printed on the appropriate portion of the bottom conductive layer. For instance of capacitor fabrication, the insulation layer can be designed to be ~1 mm larger than the printed conductive layer. For instance of inductor fabrication, the printed insulation has a via cavity where the top conductive trace of the inductor will be connected.

Finally, the top conductive layer can be printed to complete fabrication of the electronic component. Each layer can have one or more coatings. Multiple coatings of conductive layer reduce resistivity, but can increase surface irregularities. Multiple coatings of insulation layer increase thickness, hence dielectric property.

The process can further be utilized to fabricate resistors using multiple layers. Examples are shown in FIG. 15, where the insulation layer is replaced with a high-resistivity polymer (e.g. polypyrrole, PPy). The bottom conductive layer and the high-resistive polymer layer form the resistance. Depending on the contact dimension of the conductive layer and the resistive polymer, the resistance of the component can be altered. Furthermore, a mixture of PPy with silver nanoparticle can be utilized for resistances of various magnitudes.

Furthermore, the process can be utilized to fabricate active components such as diodes, transistors, LEDs, photosensors, and solar cells. These active and passive components can be fabricated on the printed circuit or PCB within a monolithic fabrication process. This can lead to a fabrication process for a complete electronic circuit or system on the substrate with a single monolithic additive printing process.

After each printing layer, for some substrates such as polyimide and for some inks such as silver nanoparticle based inks, a special curing process called sintering might be needed. The sintering process involved thermal process at an elevated temperature or utilizing a high power optical energy delivery on the printed traces to cure the ink by eliminating or evaporating the solvent or vehicle fluid that leaves the material on the printed trace. This process can be further utilized to improve conductivity and improve bonding of the molecules of the printed traces, as well as improved adherence of the printed trace with the layer underneath. In one aspect, sintering of silver ink on polyimide was performed by thermal sintering at 250° C. for 15 minutes to achieve conductive traces of silver nanoparticles.

Notably, the multilayer additive PCB described herein below has various advantages over the traditional printed circuits or PCBs of the related art. In particular, using the above-described method of printing, a complex multilayer printed circuit may be developed with additive printing technology and a thin overall thickness of the printed circuit to maintain the advantageous flexibility and conformity of the circuit board. The biocompatible or biodegradable substrate of the printed circuit allows for the development of wearable or implantable and disposable sensors and stimulators that may be used for routine monitoring of physiological signals for different biomedical applications. For example, such sensors may be worn by a subject for the monitoring of heart rate variability, respiration patterns, body temperature, etc. The developed printed circuits or PCBs may also be incorporated with surface mount components which are already known in the art to develop functional circuits. The cost of manufacturing the above-described circuits may also be reduced as multiple sensors may be batch printed and batch processed, also reducing the time required for manufacturing.

The disclosure has been described in detail with reference to exemplary embodiments thereof. However, it will be appreciated by those skilled in the art that changes may be made in these exemplary embodiments without departing from the principles and spirit of the invention, the scope of which is defined in the appended claims and their equivalents.

What is claimed is:

1. A method of producing a multilayer printed circuit, comprising:
   printing a first conductive layer on a substrate;
   printing an insulation layer having a uniform thickness on the first conductive layer and the substrate, less via cavities, test point cavities, and a surface mount component contact point, and mounting cavities, wherein the vias are printed with conductive ink inside of the via cavities;
   printing a second conductive layer on the vias and over the insulation layer;
   repeatedly printing the insulation layer, the vias, and the conductive layers, in sequence, to form the multilayer printed circuit; and
   printing a top coating layer on the insulation layer and the second conductive layer.

2. The method of claim 1, wherein the insulation layer, the vias, and the conductive layers are repeatedly printed in sequence to form a multilayer printed circuit board (PCB).

3. The method of claim 1, wherein the insulation layer is printed on either the first conductive layer of the substrate.

4. The method of claim 1, further comprising printing two or more insulation material coatings for the insulation layer on the substrate.

5. The method of claim 4, wherein one of the coatings of the insulation layer is a pyrrole insulation coating printed.

6. The method of claim 1, wherein an electronic component is attached at the surface mount contact point and is attached to the first or the second conductive layer by printing with a conductive ink, soldering or silver epoxy.

7. The method of claim 1, wherein the first and second conductive layers have about a same thickness, and the thickness ranges from about 250 nm to about 500 nm.

8. The method of claim 1, wherein the first conductive layer, the insulation layer, the second conductive layer and the vias are printed in multiple coatings.

9. The method of claim 1, wherein an ink composition for printing the first conductive layer, or the second conductive layer comprises an amount of about 30-50 wt % of silver nanoparticles having an average size of about 50 nm to 200 nm, based on a total weight of the ink composition, and the ink composition has a viscosity of about 1 to 100 cPa.

10. The method of claim 1, wherein a drop spacing for printing of the first conductive layer, the insulation layer, the second conductive layer and the top coating layer is of about 10 μm to 100 μm.

11. The method of claim 1, wherein a drop rate for each printing of the first conductive layer, the insulation layer, the second layer and the top coating layer is of about 5 kHz to 50 kHz.

12. The multilayer printing method of claim 1, wherein the insulation layer, the vias, and the conductive layers are repeatedly printed in sequence to form electronic components.

13. The method of claim 12, wherein the electronic components are active or passive components or a combination thereof.

14. The method of claim 13, wherein the passive components are at least one selected from the group consisting of: resistors, capacitors, and inductors.

15. The method of claim 13, wherein the active components are at least one selected from the group consisting of: diodes, transistors, liquid emitting diodes (LEDs), photosensors, and solar cells.

16. The method claimed in 1, wherein the insulation layer, the vias, and the conductive layers are repeatedly printed in sequence to form electronic circuits or systems using a same monolithic additive fabrication process.

17. The method claimed in 16, wherein the additive printed layers are at least one selected from the group consisting of: low-conductivity polymers, semi-conductive polymers, electron donors, and electron acceptors.

* * * * *